(12) United States Patent
Sueno

(10) Patent No.: US 11,026,360 B2
(45) Date of Patent: Jun. 1, 2021

(54) METHOD FOR MANUFACTURING A MOUNTING BOARD

(71) Applicant: Panasonic Intellectual Property Management Co., Ltd., Osaka (JP)

(72) Inventor: Shigeru Sueno, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 250 days.

(21) Appl. No.: 16/140,789

(22) Filed: Sep. 25, 2018

(65) Prior Publication Data

US 2019/0104656 A1 Apr. 4, 2019

(30) Foreign Application Priority Data

Oct. 3, 2017 (JP) .............................. JP2017-193178

(51) Int. Cl.
| | |
|---|---|
| H05K 3/30 | (2006.01) |
| H05K 13/04 | (2006.01) |
| H05K 13/00 | (2006.01) |
| H05K 13/08 | (2006.01) |
| H01L 23/00 | (2006.01) |

(Continued)

(52) U.S. Cl.
CPC ......... *H05K 13/0409* (2018.08); *H01L 24/00* (2013.01); *H05K 13/0069* (2013.01); *H05K 13/0406* (2018.08); *H05K 13/0411* (2018.08); *H05K 13/0882* (2018.08); *G02F 1/1303* (2013.01); *G02F 1/13454* (2013.01); *Y10T 29/4913* (2015.01)

(58) Field of Classification Search
USPC .......... 29/832, 739, 740, 743, 836, 840, 841
See application file for complete search history.

(56) References Cited

U.S. PATENT DOCUMENTS 8,029,638 B2 * 10/2011 Onitsuka ................. H01L 24/75
156/299
2008/0301932 A1 12/2008 Murata et al.
(Continued)

FOREIGN PATENT DOCUMENTS

| CN | 1981567 A | 6/2007 |
|---|---|---|
| CN | 101933128 A | 12/2010 |
| JP | 2006-024797 | 1/2006 |

OTHER PUBLICATIONS

English Translation of Chinese Search Report dated Jan. 18, 2021 for the related Chinese Patent Application No. 201811136659.4.

*Primary Examiner* — Thiem D Phan
(74) *Attorney, Agent, or Firm* — Pearne & Gordon LLP

(57) ABSTRACT

There is provided a component mounter that performs pressure-bonding of a plurality of components placed on the board, to the board, the component mounter including: a board holder that holds the board and lifts and lowers the held board; a plurality of backups that support, from a side below the board, at least one of the plurality of components placed on the held board and are each provided with a suction port which suctions an undersurface of the board; a sucking unit that is connected to the suction port and performs vacuum-sucking of the board placed on the plurality of backups; and at least one pressure-bonding head that performs pressure-bonding of the plurality of components placed on the suctioned board, to the board.

10 Claims, 6 Drawing Sheets

(51) Int. Cl.
*G02F 1/13* (2006.01)
*G02F 1/1345* (2006.01)

(56) References Cited

U.S. PATENT DOCUMENTS

2010/0243153 A1    9/2010  Onitsuka et al.
2018/0070486 A1*   3/2018  Adachi ............. H05K 13/0015

* cited by examiner

METHOD FOR MANUFACTURING A MOUNTING BOARD

BACKGROUND

1. Technical Field

The present disclosure relates to a component mounter, which performs pressure-bonding of a component placed on a board so as to manufacture a mounting board, and a method for manufacturing the mounting board.

2. Description of the Related Art

A component mounter that manufactures a mounting board such as a liquid crystal panel board causes a pressure-bonding head to apply pressure from above components to the board, on which components piled on a tape-shaped anisotropic conductive film (ACF) as a bonded adhesive member are placed, so as to perform pressure-bonding of the components to the board (for example, see Japanese Patent Unexamined Publication No. 2006-24797). In the component mounter disclosed in Japanese Patent Unexamined Publication No. 2006-24797, in order to correct warpage of the board that easily warps like a large liquid crystal panel and performs pressure-bonding of the component, in addition to a backup stage that supports, from below, the components which are pressurized from above, a warpage correcting unit that suctions an undersurface of the board so as to correct the warpage of the board is provided together with the backup stage.

SUMMARY

According to the disclosure, there is provided a component mounter that performs pressure-bonding of a plurality of components placed on a board, to the board, the component mounter including: a board holder that holds the board and lifts and lowers the held board; a plurality of backups that support, from a side below the board, at least one of the plurality of components placed on the held board and are each provided with a suction port which suctions an undersurface of the board; a sucking unit that is connected to the suction port and performs vacuum-sucking of the board placed on the plurality of backups; and at least one pressure-bonding head that performs pressure-bonding of the plurality of components placed on the suctioned board, to the board.

According to the disclosure, there is provided a method for manufacturing a mounting board, including: a board holding step of holding a board by using a board holder; a board lowering step of lowering the held board and placing the board onto a plurality of backups that support, from a side below the board, at least one of a plurality of components placed on the board; a board suctioning step of performing vacuum-sucking by suction ports provided in the plurality of backups and suctioning an undersurface of the board; and a component pressure-bonding step of pressure-bonding the plurality of components placed on the suctioned board, to the board, by using at least one pressure-bonding head.

According to the disclosure, it is possible to appropriately perform the pressure-bonding of the components to the board, even when the board is a thin panel.

DETAILED DESCRIPTION

In the related art including Japanese Patent Unexamined Publication No. 2006-24797, warpage is not sufficiently corrected for a thin panel that has a thin thickness of a board and is likely to have deformation such as a wrinkle or warpage, and a problem arises in that further improvement needs to be achieved in order to perform appropriate pressure-bonding of a component to the board.

An object of the disclosure is to provide a component mounter and a method for manufacturing a mounting board in which it is possible to appropriately perform pressure-bonding of a component to a board even when the thin panel is used.

Hereinafter, an exemplary embodiment of the disclosure will be described with reference to the figures. FIGS. 1, 2, 3A, and 3B illustrate component mounter 1 in the exemplary embodiment. Component mounter 1 is an apparatus that performs pressure-bonding of component 3 placed on board 2 (for example, a thin panel or a flexible board) or the like which is made from a film-like member and mounts the component on board 2. In the following description, a left-right direction when viewed from operator OP is set to an X-axis direction. In addition, a front-rear direction when viewed from operator OP is set to a Y-axis direction, and an up-down direction viewed therefrom is set to a Z-axis direction.

Figure 1:
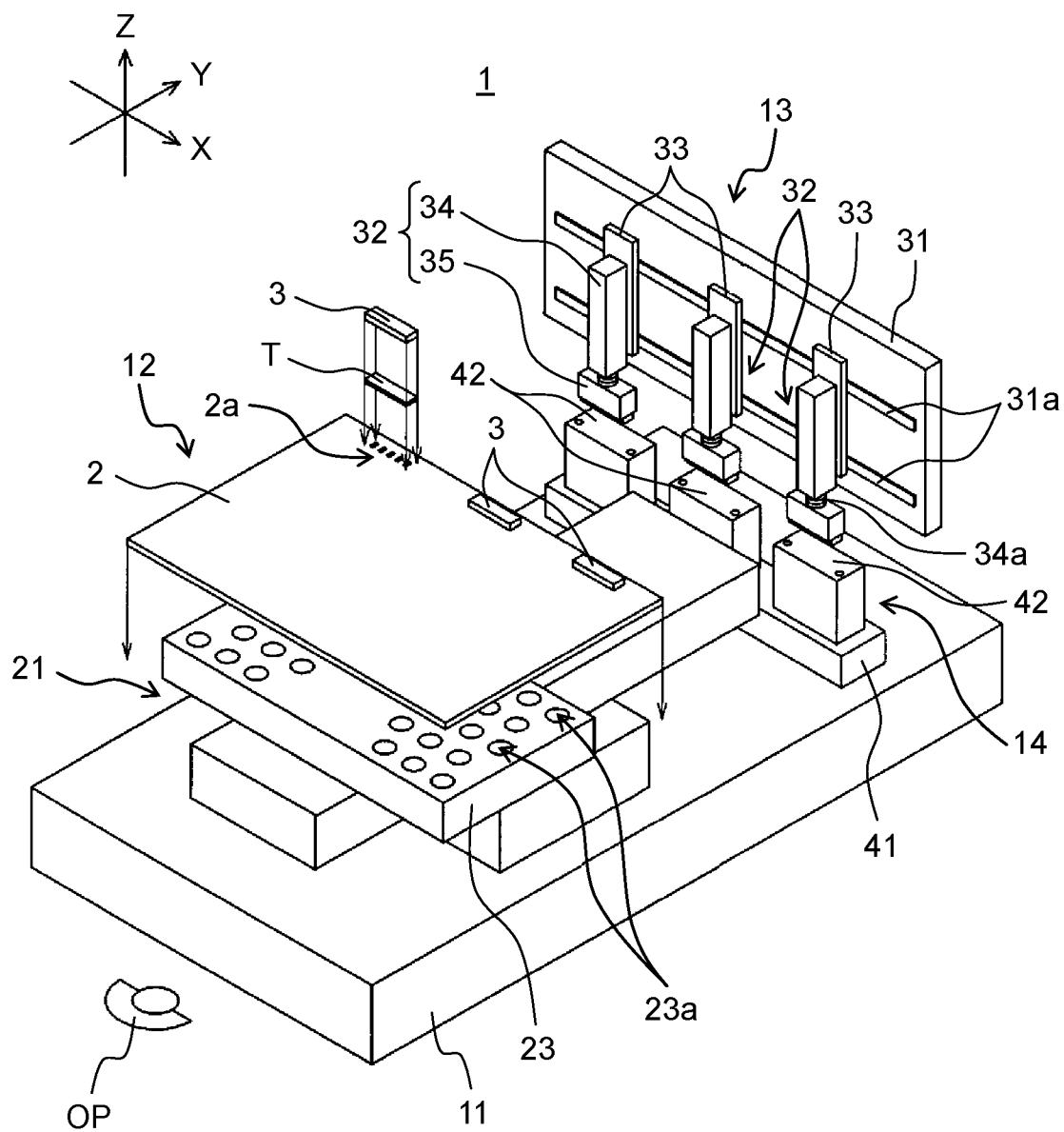
FIG. 1 is a perspective view of a component mounter of an exemplary embodiment of the disclosure.

In FIG. 1, electrode 2a is provided at an end portion of a top surface of board 2. Thermosetting resin tape T of an ACF or the like is pasted to electrode 2a in the previous step. Component 3 is placed on thermosetting resin tape T in a state in which a position of a component terminal (not shown) formed on an undersurface of component 3 is coincident with electrode 2a of board 2. In an example of FIG. 1, three components 3 are placed on board 2.

Component mounter 1 includes board holding mover 12 on base 11, pressure bonder 13, and pressure-bonding support 14. Board holding mover 12 is provided in a front part (on a near side when viewed from operator OP) of base 11, and pressure bonder 13 and pressure-bonding support 14 are provided in a rear part (on a rear side when viewed from operator OP) of base 11.

In FIG. 1, board holding mover 12 includes table moving mechanism 21 provided on base 11, table lifting/lowering unit 22 (refer to FIG. 3B), and board holding table 23 which overlap each other in this order from below. Table moving mechanism 21 moves table lifting/lowering unit 22 in the X-axis direction and the Y-axis direction (that is, a horizontal in-plane direction). Table lifting/lowering unit 22 lifts and lowers board holding table 23 in the Z-axis direction.

Board holding table 23 supports a central region of an undersurface of board 2 supplied from the outside of component mounter 1 to a top surface of the board holding table. A plurality of board sucking ports 23a that suction and hold board 2 are formed in a region of the top surface of board holding table 23, which supports the undersurface of board 2. As described above, board holding mover 12 is board holding means that holds board 2, moves the held board 2 in the horizontal in-plane direction, and lifts and lowers the board. In other words, board holding mover 12 is an example of a board holder.

In FIG. 1, pressure bonder 13 includes base portion 31 and a plurality of (three in the example) pressure-bonding units 32 which are installed on base portion 31 and of which positions in the X-axis direction are adjustable. A pair of guides 31a extending in the X-axis direction is provided on base portion 31. A plurality of attachment members 33 having a rectangular flat plate shape, which are disposed to have a vertical posture, are installed on the guides 31a so as to be adjustable in the X-axis direction.

Pressure-bonding unit 32 includes pressurizing mechanism 34 and pressure-bonding head 35. Pressurizing mechanism 34 is attached to attachment member 33. Pressurizing mechanism 34 has rod 34a that is vertically extendable and retractable. Pressure-bonding head 35 is installed on a lower end portion of rod 34a. A plurality of pressure-bonding heads 35 are disposed side by side in a line in the X-axis direction above pressure-bonding support 14. Operator OP adjusts pressure-bonding unit 32 to a desired position, thereby, changing pressure-bonding head 35 depending on the position of component 3 placed on board 2.

Pressure-bonding head 35 has a built-in heater (not shown), and a pressure-bonding side of component 3 is heated to a predetermined temperature by the heater. Pressure-bonding head 35 is lowered by driving of pressurizing mechanism 34 and performs pressure-bonding of component 3 placed on board 2 while heating the component. At this time, heat transmitted from pressure-bonding head 35 promotes hardening of thermosetting resin tape T. The plurality of pressure-bonding units 32 are installed on base portion 31 so as to correspond to the number of components 3 to be pressure-bonded. In addition, component mounter 1 includes pressure-bonding heads 35 having different sizes from each other, and pressure-bonding head 35 corresponding to a shape of component 3 to be pressure-bonded is installed to rod 34a.

In FIG. 1, pressure-bonding support 14 includes fixed unit 41 and a plurality of (three in the example) backups 42 which are installed on fixed unit 41 and of which positions in the X-axis direction are adjustable. Operator OP changes the position of backup 42 in the X-axis direction depending on the position of component 3 placed on board 2 and fixes the position of backup 42 by the fixed unit 41. In other words, in component mounter 1, disposing positions of the plurality of backups 42 are changeable depending on the positions of the plurality of components 3 placed on board 2.

Figure 2:
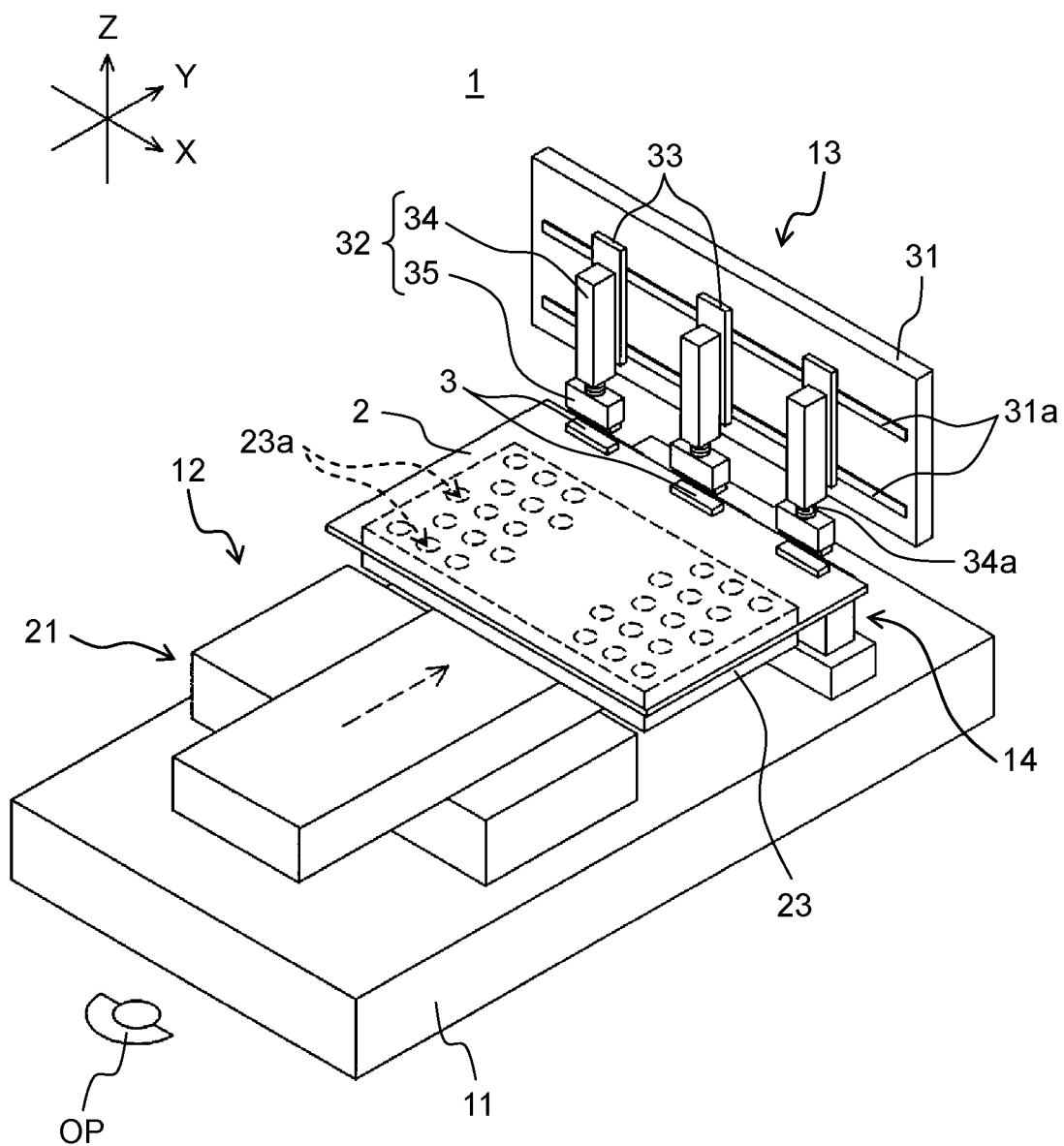
FIG. 2 is a perspective view of the component mounter of the exemplary embodiment of the disclosure.
Figure 3A:
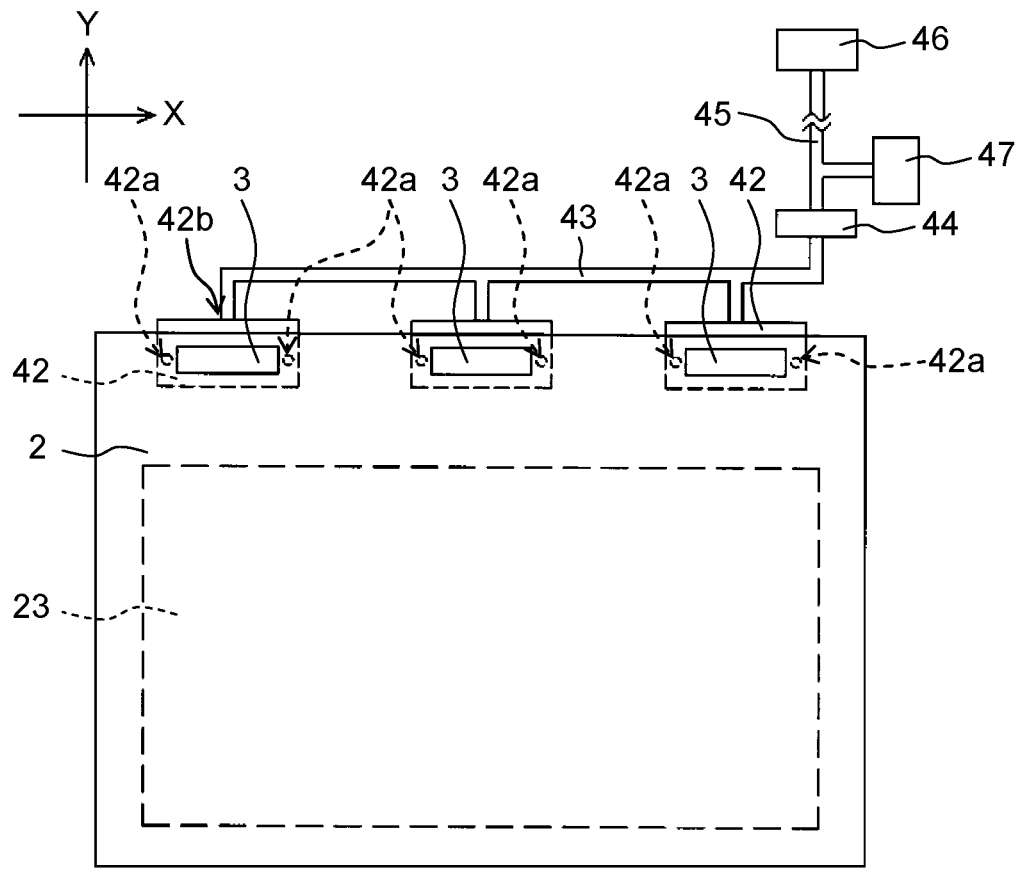
FIG. 3A is a plan view of the component mounter of the exemplary embodiment of the disclosure.
Figure 3B:
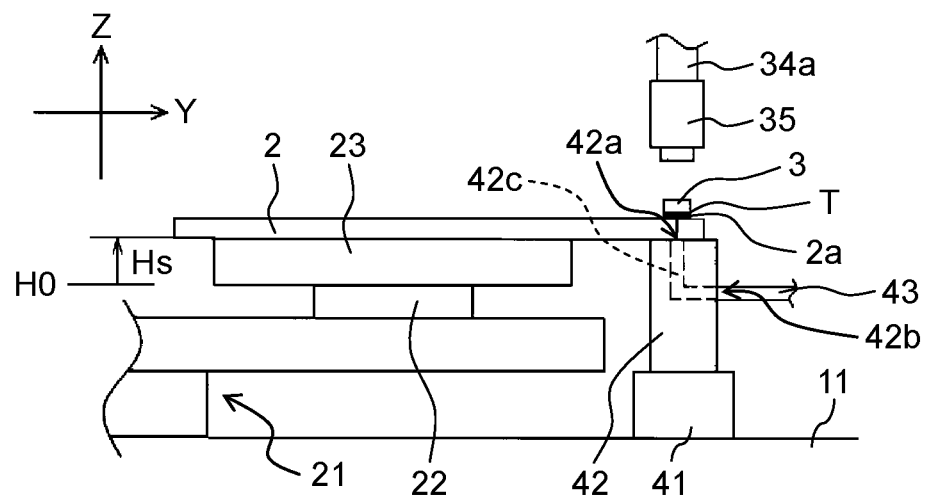
FIG. 3B is a side view of the component mounter of the exemplary embodiment of the disclosure.

FIGS. 2, 3A, and 3B illustrate a state in which board holding mover 12 causes the horizontal in-plane directions of boards 2 held by board holding table 23 to be coincident with each other, and then boards 2 are lowered to be supported by backups 42.

In FIGS. 3A and 3B, a plurality of suction ports 42a are open at predetermined positions in a top surface of backup 42. Connection port 42b is open in a side surface of backup 42 on a rear portion side thereof. Communication spaces 42c from the plurality of suction ports 42a to connection port 42b are formed inside backup 42. Connection ports 42b of the plurality of backups 42 disposed on fixed unit 41 are connected to each other in parallel through connection pipe 43 and are connected to one end of vacuum valve 44. The other end of vacuum valve 44 is connected to vacuum pump 46 via coupling pipe 45. Vacuum sensor 47 that measures a vacuum degree in the inside of coupling pipe 45 is connected to coupling pipe 45.

When vacuum valve 44 is opened in a state in which vacuum pump 46 is actuated, communication is performed from vacuum pump 46 to each suction port 42a of backup 42 such that vacuum sucking is performed by suction port 42a. When vacuum pump 46 is actuated such that vacuum valve 44 is opened in a state in which board 2 that is held by board holding table 23 is coincident with a pressure-bonding working position, and the undersurface of board 2 is supported by backup 42, and board 2 is vacuum-sucked by suction port 42a. In other words, vacuum pump 46 is sucking means that is connected to suction port 42a and performs vacuum-sucking of board 2 that is placed on the plurality of backups 42. In other words, vacuum pump 46 is an example of a sucking unit.

As described above, when board 2 is vacuum-suctioned, and every suction port 42a of every backup 42 is blocked by the undersurface of board 2, the vacuum degree in coupling pipe 45 decreases. On the other hand, in a case where a height position of board 2 is high such that there is a gap between the undersurface of board 2 and the top surface of backup 42, or board 2 is warped such that a gap is formed between a part of suction port 42a and the undersurface of board 2, air flows in from opened suction port 42a, and thus the vacuum degree in coupling pipe 45 does not decrease. The vacuum degree in coupling pipe 45 is measured by vacuum sensor 47, and thereby it is possible to detect that board 2 is normally suctioned to backup 42.

In other words, vacuum sensor 47 is a suction sensor that detects that board 2 is suctioned to backup 42. In other words, vacuum sensor 47 detects that suction port 42a suctions the undersurface of board 2. Vacuum sensor 47 may be disposed for each of backups 42. In this manner, it is possible to narrow down whether backup 42 in which a suction defect occurs. In addition, as the suction sensor, gap measuring means for measuring a gap between the top surface of backup 42 and the undersurface of board 2 may be used.

In FIG. 3B, a height position, at which board 2 that is held by board holding table 23 is normally suctioned to backup 42, is referred to as suction height Hs when viewed from reference height 110 that is set in component mounter 1. When components 3 placed on boards 2 are pressure-bonded to boards 2, the horizontal in-plane directions of boards 2 held by board holding table 23 are caused to be coincident with each other in a state in which vacuum valve 44 is closed, and then boards 2 are lowered to suction height Hs and are supported by backups 42. Subsequently, vacuum valve 44 is opened, and board 2 is vacuum-suctioned to backup 42.

In FIG. 3A, suction port 42a is provided at a position that does not overlap at least one of the plurality of components 3 supported by the plurality of backups 42 via boards 2 in plan view from above. Consequently, when pressure-bonding is performed by pressure-bonding head 35, it is possible to apply uniform heat and pressure to component 3, and thus it is possible to reliably perform the pressure-bonding of component 3. The plurality of components 3 may be supported by one backup 42. Even in this case, suction port 42a is provided at the position which does not overlap the plurality of components 3. In addition, pressure-bonding head 35 may perform pressure-bonding of components 3 that are supported by the plurality of backups 42.

As described above, the plurality of backups 42 disposed corresponding to the positions of the plurality of components 3 support at least one of the plurality of components 3 placed on held board 2, from a side below board 2 and are each provided with suction port 42a which suctions the undersurface of board 2. The plurality of pressure-bonding heads 35 disposed corresponding to the positions of the plurality of components 3 performs the pressure-bonding of the plurality of components 3 placed on suctioned board 2, to the board 2. In other words, component mounter 1 includes a plurality of pressure-bonding heads 35 corresponding to backups 42. In other words, the plurality of pressure-bonding heads 35 correspond to the plurality of respective backups 42.

Figure 4:
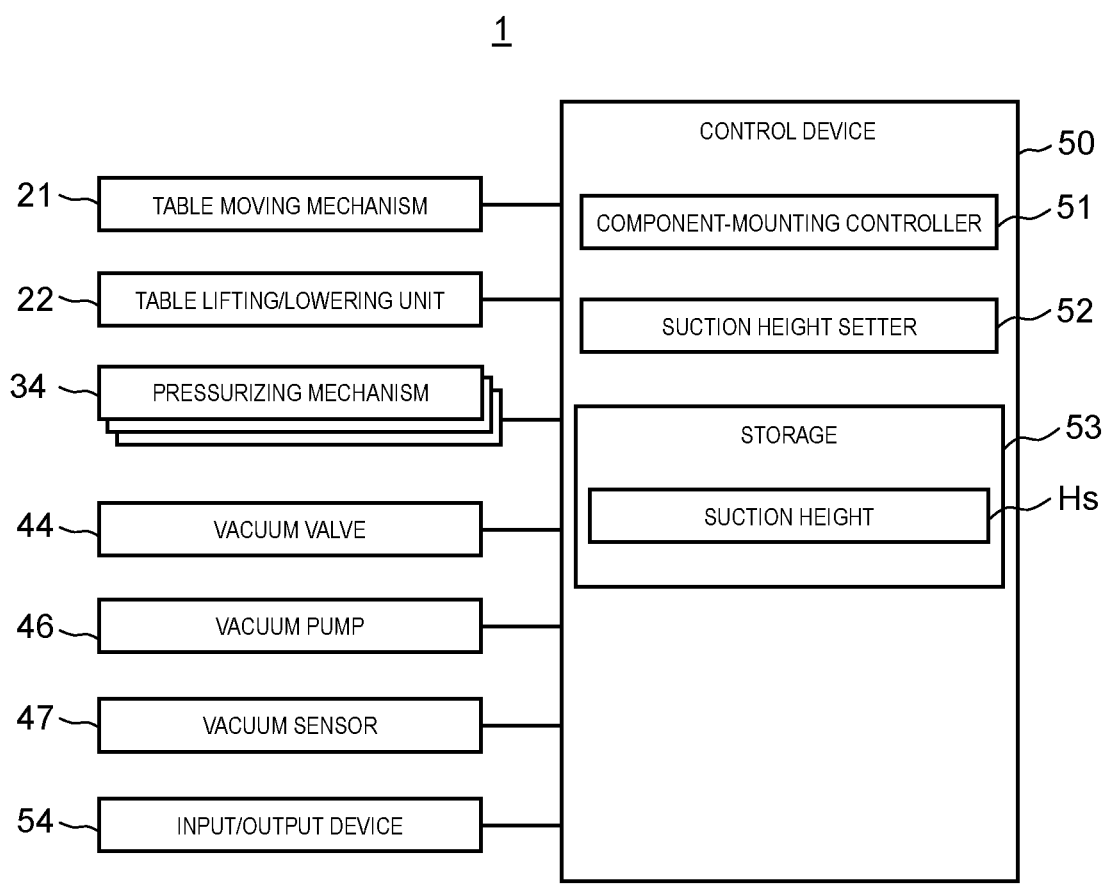
FIG. 4 is a block diagram illustrating a control system of the component mounter of the exemplary embodiment of the disclosure.

In FIG. 4, control device 50 included in component mounter 1 includes component-mounting controller 51, suction height setter 52, and storage 53. Storage 53 is a storage device and stores suction height Hs or the like. Component-mounting controller 51 controls movement to the horizontal in-plane direction of table lifting/lowering unit 22 (that is, board holding table 23) by table moving mechanism 21, movement of board holding table 23 in the Z-axis direction by table lifting/lowering unit 22, and extending/retracting operation (that is, lifting/lowering motion of pressure-bonding head 35) of rod 34a by pressurizing mechanism 34.

In addition, component-mounting controller 51 controls an opening/closing operation of vacuum valve 44, actuation of vacuum pump 46, and measurement of vacuum degree by vacuum sensor 47. Input/output device 54 such as a touch panel is connected to control device 50, and thus operator OP can perform a necessary input to component mounter 1 through input/output device 54. Operator OP can obtain various types of information related to component mounter 1 through input/output device 54.

In FIG. 4, suction height setter 52 controls table lifting/lowering unit 22, vacuum valve 44, vacuum pump 46, and vacuum sensor 47 so as to execute setting work of suction height Hs. In addition, suction height setter 52 displays a suction height setting window on input/output device 54 when suction height Hs is set and supports setting work of suction height Hs by operator OP.

Figure 5:
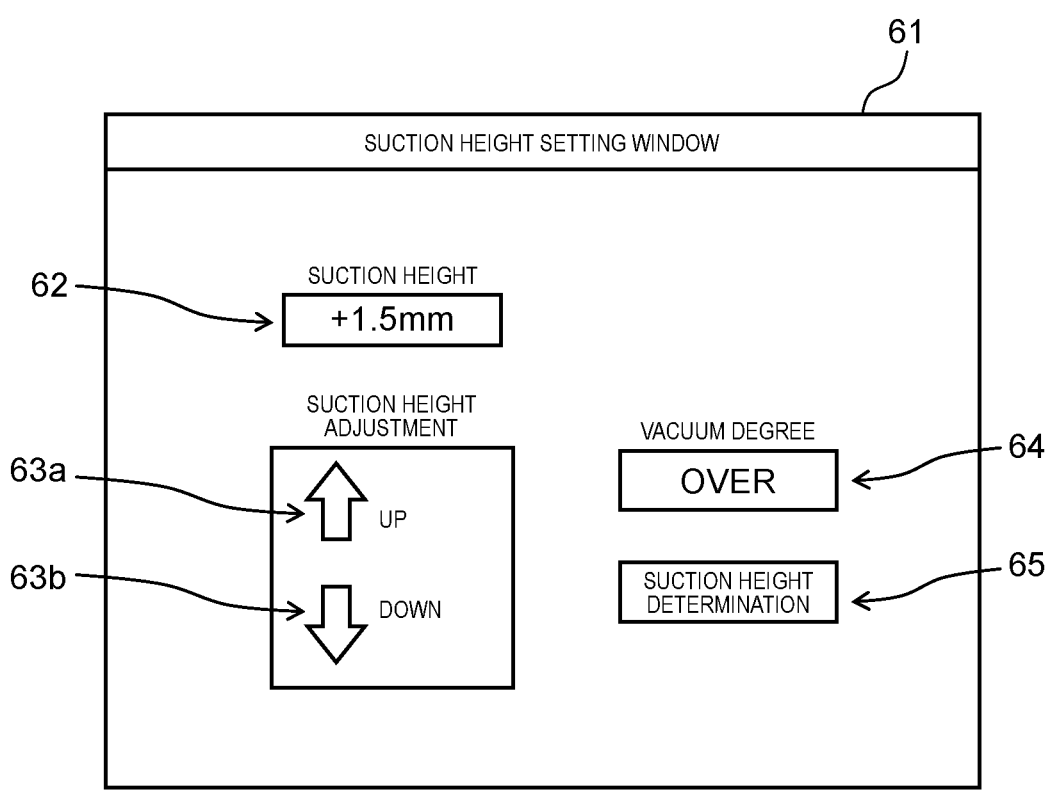
FIG. 5 is a diagram illustrating a suction height setting window for setting a suction height of the component mounter of the exemplary embodiment of the disclosure.

Here, with reference to FIG. 5, an example of suction height setting window 61 that is displayed on input/output device 54 is described. On suction height setting window 61, "suction height" display frame 62, "UP" button 63a, "DOWN" button 63b, "vacuum degree" display frame 64, and "suction height determination" button 65 are displayed. In "suction height" display frame 62, a height (suction height Hs) of current board 2 is displayed. When "UP" button 63a is operated, table lifting/lowering unit 22 lifts board 2 by a predetermined amount. When "DOWN" button 63b is operated, table lifting/lowering unit 22 lowers board 2 by a predetermined amount.

In "vacuum degree" display frame 64, current vacuum degree that is measured by vacuum sensor 47 is displayed. An observed value that is measured by vacuum sensor 47, or only a result showing whether the vacuum degree is higher or lower than a predetermined vacuum degree may be displayed on "vacuum degree" display frame 64. In FIG. 5, a measurement result of vacuum sensor 47 is higher than the predetermined vacuum degree, and "OVER" is displayed. When "suction height determination" button 65 is operated, current suction height Hs is stored to storage 53.

Next, with reference to FIG. 5, a procedure of a setting work of suction height Hs by using suction height setting window 61 that is displayed on input/output device 54 will be described. When setting work of suction height Hs is executed, backup 42 is disposed at a predetermined position, then boards 2 are held by board holding table 23, and the horizontal in-plane directions of boards are caused to be coincident with each other. In addition, suction height setter 52 actuates vacuum pump 46, and vacuum valve 44 is open.

In the setting work of suction height Hs, operator OP operates "DOWN" button 63b, boards 2 are completely suctioned by backups 42 such that boards 2 are lowered until the display in "vacuum degree" display frame 64 is lower than the predetermined vacuum degree. When board 2 is suctioned to backup 42, operator OP operates "UP" button 63a and "DOWN" button 63b and the height is finely adjusted, and then "suction height determination" button 65 is operated such that suction height Hs is determined. Consequently, set suction height Hs is stored in storage 53.

Next, a method for manufacturing a mounting board by pressure-bonding, to board 2, the plurality of components 3 placed on board 2 will be described along the flow in FIG. 6. First, operator OP disposes backup 42 at the position corresponding to component 3 placed on board 2 (ST1: backup disposing step). Subsequently, operator OP disposes pressure-bonding head 35 at the position corresponding to backup 42 (ST2: pressure-bonding head disposing step).

Subsequently, suction height setter 52 displays suction height setting window 61 on input/output device 54. Operator OP determines suction height Hs while operating suction height setting window 61. Consequently, suction height Hs is stored in storage 53. In other words, board 2 that is held by board holding mover 12 (board holding means) is lowered while suction port 42a performs vacuum-sucking, and suction height Hs, at which board 2 is suctioned by backup 42, is measured and registered (ST3: suction height registering step). Consequently, preparation of pressure-bonding work to board 2 is ended.

Subsequently, in FIG. 6, operator OP causes board holding table 23 of board holding mover 12 (board holding means) to hold board 2 (ST4: board holding step). Subsequently, component-mounting controller 51 moves board holding table 23 and causes the horizontal in-plane directions of held boards 2 to be coincident with each other (ST5: board holding table moving step). Subsequently, component-mounting controller 51 lowers board 2, which is held by board holding table 23, to suction height Hs such that boards 2 are placed on the plurality of backups 42 that supports at least one of the plurality of components 3, which are placed on board 2, from the side below board 2 (ST6: board lowering step).

Subsequently, component-mounting controller 51 causes vacuum valve 44 to be opened in a state in which vacuum pump 46 is actuated, and the vacuum-sucking is performed by suction port 42a provided in backup 42 such that board suction of suctioning the undersurface of board 2 is started (ST7: suction starting step). Subsequently, component-mounting controller 51 determines whether or not the undersurface of board 2 is suctioned by backup 42 from a measurement result by vacuum sensor 47 (ST8: suction determining step). In a case where board 2 is suctioned (YES in ST8), component-mounting controller 51 lowers pressure-bonding head 35, and performs pressure-bonding of component 3, which is placed on board 2 suctioned by backup 42, to board 2 by pressure-bonding head 35 (ST9: component pressure-bonding step).

Figure 6:
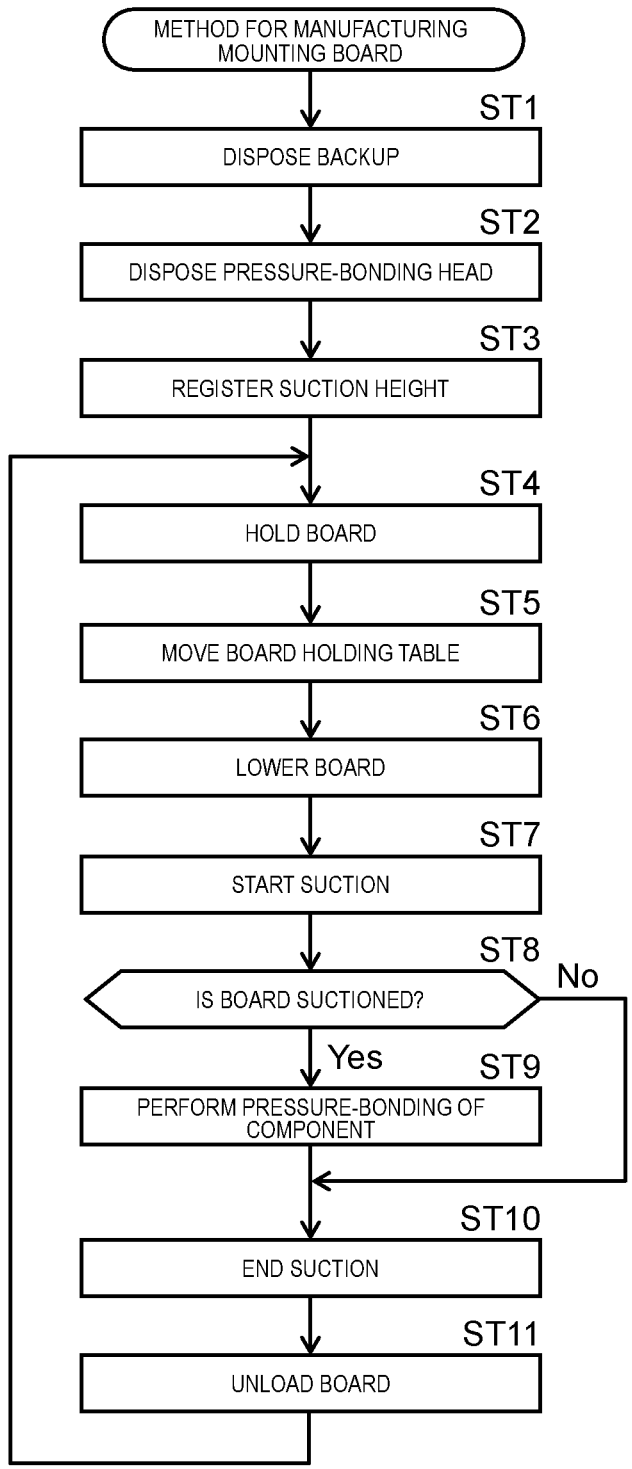
FIG. 6 is a flowchart of a method for manufacturing a mounting board by the component mounter of the exemplary embodiment of the disclosure.

In FIG. 6, when pressure-bonding is ended, component-mounting controller 51 closes vacuum valve 44 and ends suction of board 2 by backup 42 (ST10: suction ending step). Subsequently, component-mounting controller 51 lifts board 2 to a height at which there is no interference with backup 42, moves the board to a position (that is, a position at which board 2 is held) at which board 2 is unloaded, and operator OP picks up board 2 (ST11: board unloading step). Consequently, a series of component pressure-bonding work performed by component mounter 1 is ended, the process returns to the board holding step (ST4), and board 2 as the following work target is held by board holding table 23.

In a case where the undersurface of board 2 is not suctioned in the suction determining step (ST8) (No in ST8), component-mounting controller 51 skips the component pressure-bonding step (ST9) on board 2 and executes the suction ending step (ST10) and the board unloading step (ST11). In other words, the board 2 is detached from component mounter 1 without pressure-bonding of component 3. Consequently, even in a case where it is not possible to normally suction board 2 by backup 42 due to warpage of board 2, it is possible to prevent the component pressure-bonding work from being executed and a pressure-bonding defect from occurring in advance.

As described above, from the suction starting step (ST7) to the suction ending step (ST10), there is provided a board suctioning step of vacuum-sucking by suction port 42*a* provided in backup 42 and suctioning the undersurface of board 2. In a case where whether or not the undersurface of board 2 is suctioned in the board suctioning step (ST8) is determined and the undersurface of board 2 is not suctioned (No in ST8), the component pressure-bonding step (ST9) for board 2 is skipped.

As described above, the component mounter 1 of the exemplary embodiment includes board holding means (board holding mover 12) that holds board 2 and lifts and lowers held board 2; the plurality of backups 42 that support, from the side below board 2, at least one of the plurality of components 3 placed on held board 2 and are each provided with the suction port 42*a* which suctions the undersurface of board 2; sucking means (vacuum pump 46) that is connected to suction port 42*a* and performs vacuum-sucking of board 2 that is placed on the plurality of backups 42; and pressure-bonding head 35 that performs pressure-bonding of the plurality of components 3 placed on suctioned board 2, to the board 2. The plurality of components 3 placed on board 2 are pressure-bonded to board 2. Consequently, it is possible to appropriately perform the pressure-bonding of components 3 to board 2, even when the board is a thin panel.

Component mounter 1 is not limited to the independent mounter having a function of performing the pressure-bonding of component 3 placed on board 2. For example, a configuration may be employed, in which an apparatus integrally includes a tape bonder that bonds thermosetting resin tape T to board 2, a component placer that places component 3 to board 2, and a board transferring mechanism that transfers board 2 between elements, and the apparatus further includes a component pressure bonder (component mounter 1) that includes the board holding means, backups 42, the sucking means, and pressure-bonding head 35 which are described above.

The component mounter and the method for manufacturing a mounting board of the disclosure have an effect of making it possible to appropriately perform pressure-bonding of the component to the board even when the thin panel is used, and the mounter and the method are also used in a field of mounting a component on a board.

What is claimed is:

1. A method for manufacturing a mounting board, the method comprising:
    a board holding step of holding a board by using a board holder;
    a board lowering step of lowering the held board and placing the board onto a plurality of backups that support at least one of a plurality of components placed on the board from a side below the board;
    a board suctioning step of performing vacuum-sucking by suction ports-provided in the plurality of backups and suctioning an undersurface of the board; and
    a component pressure-bonding step of pressure-bonding the plurality of-components placed on the suctioned board, to the board, by using at least one pressure-bonding head,
    wherein, in the board suctioning step, whether or not the undersurface of the board is suctioned is determined, and
    wherein, when the undersurface of the board is not suctioned, the component pressure-bonding step is skipped.

2. The method of claim 1, wherein each of the suction ports is provided at a position that does not overlap with at least one of the plurality of components supported by the plurality of backups.

3. The method of claim 1, wherein disposing positions of the plurality of backups are changeable, and
    wherein the method further comprises a backup disposing step of disposing the plurality of backups at positions corresponding to the plurality of components placed on the board before the board holding step.

4. The method of claim 1, wherein the at least one pressure-bonding head includes a plurality of pressure-bonding heads of which disposing positions are changeable, and
    wherein the method further comprises a pressure-bonding head disposing step of disposing the plurality of pressure-bonding heads at positions corresponding to the plurality of backups before the board holding step.

5. The method of claim 1, further comprising:
    a suction height registering step of lowering the board held by the board holder while the suction port performs vacuum-sucking and measuring and registering a suction height at which the board is suctioned by the plurality of backups,
    wherein, in the board lowering step, the board held by the board holder is lowered to the suction height.

6. The method of claim 1, wherein whether or not the undersurface of the board is suctioned is determined based on a vacuum degree measured by a vacuum sensor when performing vacuum suction via the suction ports provided in the plurality of backups.

7. A method for manufacturing a mounting board, the method comprising:
    a board holding step of holding a board by using a board holder;
    a board lowering step of lowering the held board and placing the board onto a backup that supports at least one component placed on the board from a side below the board;
    a board suctioning step of performing vacuum-sucking by a suction port provided in the backup and suctioning an undersurface of the board; and a component pressure-bonding step of pressure-bonding the component placed on the suctioned board, to the board, by using at least one pressure-bonding head, wherein, in the board suctioning step, whether or not the undersurface of the board is suctioned is determined, and wherein, when the undersurface of the board is not suctioned, the component pressure-bonding step is skipped.

8. The method of claim 7,
wherein the suction port is provided at a position that does not overlap with the at least one component supported by the backup.

9. The method of claim 7, further comprising:

a suction height registering step of lowering the board held by the board holder while the suction port performs vacuum-sucking and measuring and registering a suction height at which the board is suctioned by the backup, wherein, in the board lowering step, the board held by the board holder is lowered to the suction height.

10. The method of claim 7, wherein whether or not the undersurface of the board is suctioned is determined based on a vacuum degree measured by a vacuum sensor when performing vacuum suction via the suction port provided in the backup.

* * * * *